United States Patent
Arunasalam et al.

(10) Patent No.: US 8,925,793 B2
(45) Date of Patent: Jan. 6, 2015

(54) METHOD FOR MAKING A SOLDER JOINT

(71) Applicant: DunAn Microstaq, Inc, Austin, TX (US)

(72) Inventors: Parthiban Arunasalam, Austin, TX (US); Siddharth Bhopte, Austin, TX (US); Joe Albert Ojeda, Sr., Austin, TX (US)

(73) Assignee: DunAn Microstaq, Inc., Austin, TX (US)

( * ) Notice: Subject to any disclaimer, the term of this patent is extended or adjusted under 35 U.S.C. 154(b) by 33 days.

(21) Appl. No.: 13/663,698

(22) Filed: Oct. 30, 2012

(65) Prior Publication Data

US 2013/0175330 A1    Jul. 11, 2013

Related U.S. Application Data

(60) Provisional application No. 61/583,364, filed on Jan. 5, 2012.

(51) Int. Cl.
*B23K 1/20* (2006.01)
*B23K 35/14* (2006.01)

(52) U.S. Cl.
USPC .......... 228/246; 228/56.3; 228/223; 228/224; 228/245

(58) Field of Classification Search
USPC .................. 228/56.3, 224, 245, 246
See application file for complete search history.

(56) References Cited

U.S. PATENT DOCUMENTS

| | | | |
|---|---|---|---|
| 668,202 A | 2/1901 | Nethery | |
| 886,045 A | 4/1908 | Ehrlich et al. | |
| 1,886,205 A | 11/1932 | Lyford | |
| 1,926,031 A | 9/1933 | Boynton | |
| 2,412,205 A | 12/1946 | Cook | |
| 2,504,055 A | 4/1950 | Thomas | |
| 2,651,325 A | 9/1953 | Lusignan | |
| 2,840,107 A | 6/1958 | Campbell | |
| 2,875,779 A | 3/1959 | Campbell | |
| 3,031,747 A | 5/1962 | Green | |

(Continued)

FOREIGN PATENT DOCUMENTS

| | | |
|---|---|---|
| DE | 2215526 | 10/1973 |
| DE | 2930779 | 2/1980 |

(Continued)

OTHER PUBLICATIONS

Alpha Exactalloy Solder Performs [online], [retrieved Jan. 5, 2011]. Retrieved from the Internet <URL: http://alpha.cooksonelectronics.com/products/preforms/>.

(Continued)

*Primary Examiner* — Devang R Patel
(74) *Attorney, Agent, or Firm* — MacMillan, Sobanski & Todd, LLC

(57) ABSTRACT

A method of bonding an electrical component to a substrate includes applying solder paste on to a substrate. Solder preform has an aperture is formed therethrough and is then urged into contact with the solder paste, such that solder paste is urged through the aperture. An electrical component is then urged into contact with the solder preform and into contact with the solder paste that has been urged through the aperture, thereby bonding the electrical component, the solder preform, and the substrate together to define a reflow subassembly.

18 Claims, 2 Drawing Sheets

(56) References Cited

U.S. PATENT DOCUMENTS

| | | |
|---|---|---|
| 3,540,218 A | 11/1970 | Finn |
| 3,729,807 A | 5/1973 | Fujiwara |
| 3,747,628 A | 7/1973 | Holster et al. |
| 3,860,949 A | 1/1975 | Stoeckert et al. |
| 4,005,454 A | 1/1977 | Froloff et al. |
| 4,019,388 A | 4/1977 | Hall, II et al. |
| 4,023,725 A | 5/1977 | Ivett et al. |
| 4,100,236 A | 7/1978 | Gordon et al. |
| 4,152,540 A | 5/1979 | Duncan et al. |
| 4,181,249 A | 1/1980 | Peterson et al. |
| 4,298,023 A | 11/1981 | McGinnis |
| 4,341,816 A | 7/1982 | Lauterbach et al. |
| 4,354,527 A | 10/1982 | McMillan |
| 4,434,813 A | 3/1984 | Mon |
| 4,476,893 A | 10/1984 | Schwelm |
| 4,543,875 A | 10/1985 | Imhof |
| 4,581,624 A | 4/1986 | O'Connor |
| 4,593,719 A | 6/1986 | Leonard et al. |
| 4,628,576 A | 12/1986 | Giachino et al. |
| 4,647,013 A | 3/1987 | Giachino et al. |
| 4,661,835 A | 4/1987 | Gademann et al. |
| 4,687,419 A | 8/1987 | Suzuki et al. |
| 4,752,027 A | 6/1988 | Gschwend |
| 4,772,935 A | 9/1988 | Lawler et al. |
| 4,774,760 A * | 10/1988 | Seaman et al. ............ 29/840 |
| 4,821,997 A | 4/1989 | Zdeblick |
| 4,824,073 A | 4/1989 | Zdeblick |
| 4,826,131 A | 5/1989 | Mikkor |
| 4,828,184 A | 5/1989 | Gardner et al. |
| 4,842,184 A * | 6/1989 | Miller, Jr. ............ 228/180.1 |
| 4,869,282 A | 9/1989 | Sittler et al. |
| 4,938,742 A | 7/1990 | Smits |
| 4,943,032 A | 7/1990 | Zdeblick |
| 4,946,350 A | 8/1990 | Suzuki et al. |
| 4,959,581 A | 9/1990 | Dantlgraber |
| 4,966,646 A | 10/1990 | Zdeblick |
| 5,000,009 A | 3/1991 | Clanin |
| 5,029,805 A | 7/1991 | Albarda et al. |
| 5,037,778 A | 8/1991 | Stark et al. |
| 5,050,838 A | 9/1991 | Beatty et al. |
| 5,054,522 A | 10/1991 | Kowanz et al. |
| 5,058,856 A | 10/1991 | Gordon et al. |
| 5,061,914 A | 10/1991 | Busch et al. |
| 5,064,165 A | 11/1991 | Jerman |
| 5,065,978 A | 11/1991 | Albarda et al. |
| 5,066,533 A | 11/1991 | America et al. |
| 5,069,419 A | 12/1991 | Jerman |
| 5,074,629 A | 12/1991 | Zdeblick |
| 5,082,242 A | 1/1992 | Bonne et al. |
| 5,096,643 A | 3/1992 | Kowanz et al. |
| 5,116,457 A | 5/1992 | Jerman |
| 5,131,729 A | 7/1992 | Wetzel |
| 5,133,379 A | 7/1992 | Jacobsen et al. |
| 5,142,781 A | 9/1992 | Mettner et al. |
| 5,161,774 A | 11/1992 | Engelsdorf et al. |
| 5,169,472 A | 12/1992 | Goebel |
| 5,176,358 A | 1/1993 | Bonne et al. |
| 5,177,579 A | 1/1993 | Jerman |
| 5,178,190 A | 1/1993 | Mettner |
| 5,179,499 A | 1/1993 | MacDonald et al. |
| 5,180,623 A | 1/1993 | Ohnstein |
| 5,197,517 A | 3/1993 | Perera |
| 5,209,118 A | 5/1993 | Jerman |
| 5,215,244 A | 6/1993 | Buchholz et al. |
| 5,216,273 A | 6/1993 | Doering et al. |
| 5,217,283 A | 6/1993 | Watanabe |
| 5,222,521 A | 6/1993 | Kihlberg |
| 5,238,223 A | 8/1993 | Mettner et al. |
| 5,242,097 A * | 9/1993 | Socha ............ 228/56.3 |
| 5,244,537 A | 9/1993 | Ohnstein |
| 5,267,589 A | 12/1993 | Watanabe |
| 5,271,431 A | 12/1993 | Mettner et al. |
| 5,271,597 A | 12/1993 | Jerman |
| 5,309,943 A | 5/1994 | Stevenson et al. |
| 5,323,999 A | 6/1994 | Bonne et al. |
| 5,325,880 A | 7/1994 | Johnson et al. |
| 5,333,831 A | 8/1994 | Barth et al. |
| 5,336,062 A | 8/1994 | Richter |
| 5,355,712 A | 10/1994 | Petersen et al. |
| 5,368,704 A | 11/1994 | Madou et al. |
| 5,373,984 A * | 12/1994 | Wentworth ............ 228/180.1 |
| 5,375,919 A | 12/1994 | Furuhashi |
| 5,400,824 A | 3/1995 | Gschwendtner et al. |
| 5,417,235 A | 5/1995 | Wise et al. |
| 5,445,185 A | 8/1995 | Watanabe et al. |
| 5,458,405 A | 10/1995 | Watanabe |
| 5,543,349 A | 8/1996 | Kurtz et al. |
| 5,553,790 A | 9/1996 | Findler et al. |
| 5,566,703 A | 10/1996 | Watanabe et al. |
| 5,577,533 A | 11/1996 | Cook, Jr. |
| 5,589,422 A | 12/1996 | Bhat |
| 5,611,214 A | 3/1997 | Wegeng et al. |
| 5,785,295 A | 7/1998 | Tsai |
| 5,796,169 A | 8/1998 | Dockerty et al. |
| 5,810,325 A | 9/1998 | Carr |
| 5,820,014 A * | 10/1998 | Dozier et al. ............ 228/56.3 |
| 5,838,351 A | 11/1998 | Weber |
| 5,848,605 A | 12/1998 | Bailey et al. |
| 5,856,705 A | 1/1999 | Ting |
| 5,873,385 A | 2/1999 | Bloom et al. |
| 5,908,098 A | 6/1999 | Gorman et al. |
| 5,909,078 A | 6/1999 | Wood et al. |
| 5,924,622 A * | 7/1999 | Davis et al. ............ 228/56.3 |
| 5,926,955 A | 7/1999 | Kober |
| 5,941,608 A | 8/1999 | Campau et al. |
| 5,954,079 A | 9/1999 | Barth et al. |
| 5,955,817 A | 9/1999 | Dhuler et al. |
| 5,970,998 A | 10/1999 | Talbot et al. |
| 5,994,816 A | 11/1999 | Dhuler et al. |
| 6,019,437 A | 2/2000 | Barron et al. |
| 6,023,121 A | 2/2000 | Dhuler et al. |
| 6,038,928 A | 3/2000 | Maluf et al. |
| 6,041,650 A | 3/2000 | Swindler et al. |
| 6,095,400 A * | 8/2000 | Liu ............ 228/56.3 |
| 6,096,149 A | 8/2000 | Hetrick et al. |
| 6,105,737 A | 8/2000 | Weigert et al. |
| 6,114,794 A | 9/2000 | Dhuler et al. |
| 6,116,863 A | 9/2000 | Ahn et al. |
| 6,123,316 A | 9/2000 | Biegelsen et al. |
| 6,124,663 A | 9/2000 | Haake et al. |
| 6,171,972 B1 | 1/2001 | Mehregany et al. |
| 6,182,742 B1 | 2/2001 | Takahashi et al. |
| 6,224,445 B1 | 5/2001 | Neukermans et al. |
| 6,255,757 B1 | 7/2001 | Dhuler et al. |
| 6,279,606 B1 | 8/2001 | Hunnicutt et al. |
| 6,283,441 B1 | 9/2001 | Tian |
| 6,318,101 B1 | 11/2001 | Pham et al. |
| 6,321,549 B1 | 11/2001 | Reason et al. |
| 6,386,507 B2 | 5/2002 | Dhuler et al. |
| 6,390,782 B1 | 5/2002 | Booth et al. |
| 6,408,876 B1 | 6/2002 | Nishimura et al. |
| 6,494,804 B1 | 12/2002 | Hunnicutt et al. |
| 6,505,811 B1 | 1/2003 | Barron et al. |
| 6,520,197 B2 | 2/2003 | Deshmukh et al. |
| 6,523,560 B1 | 2/2003 | Williams et al. |
| 6,533,366 B1 | 3/2003 | Barron et al. |
| 6,540,203 B1 | 4/2003 | Hunnicutt |
| 6,581,640 B1 | 6/2003 | Barron |
| 6,637,722 B2 | 10/2003 | Hunnicutt |
| 6,653,124 B1 | 11/2003 | Freeman |
| 6,662,581 B2 | 12/2003 | Hirota et al. |
| 6,694,998 B1 | 2/2004 | Hunnicutt |
| 6,724,718 B1 | 4/2004 | Shinohara et al. |
| 6,755,761 B2 | 6/2004 | Hunnicutt et al. |
| 6,761,420 B2 | 7/2004 | Fuller et al. |
| 6,786,391 B2 * | 9/2004 | Stipp et al. ............ 228/180.22 |
| 6,845,962 B1 | 1/2005 | Barron et al. |
| 6,848,610 B2 * | 2/2005 | Liu ............ 228/246 |
| 6,872,902 B2 | 3/2005 | Cohn et al. |
| 6,902,988 B2 | 6/2005 | Barge et al. |
| 6,958,255 B2 | 10/2005 | Khuri-Yakub et al. |
| 6,966,329 B2 | 11/2005 | Liberfarb |
| 7,011,378 B2 | 3/2006 | Maluf et al. |
| 7,063,100 B2 | 6/2006 | Liberfarb |

(56) References Cited

U.S. PATENT DOCUMENTS

| | | | |
|---|---|---|---|
| 7,210,502 | B2 | 5/2007 | Fuller et al. |
| 7,367,359 | B2 | 5/2008 | Maluf et al. |
| 7,372,074 | B2 | 5/2008 | Milne et al. |
| 7,449,413 | B1 | 11/2008 | Achuthan et al. |
| 7,452,800 | B2 * | 11/2008 | Sosnowchik et al. ......... 438/615 |
| 8,061,578 | B2 * | 11/2011 | Hartnett et al. ............. 228/56.3 |
| 8,113,448 | B2 | 2/2012 | Keating |
| 8,113,482 | B2 | 2/2012 | Hunnicutt |
| 8,156,962 | B2 | 4/2012 | Luckevich |
| 2002/0014106 | A1 | 2/2002 | Srinivasan et al. |
| 2002/0029814 | A1 | 3/2002 | Unger et al. |
| 2002/0096421 | A1 | 7/2002 | Cohn et al. |
| 2002/0100714 | A1 | 8/2002 | Staats |
| 2002/0168780 | A1 | 11/2002 | Liu et al. |
| 2002/0174891 | A1 | 11/2002 | Maluf et al. |
| 2003/0061889 | A1 | 4/2003 | Tadigadapa et al. |
| 2003/0096081 | A1 | 5/2003 | Lavallee et al. |
| 2003/0098612 | A1 | 5/2003 | Maluf et al. |
| 2003/0159811 | A1 | 8/2003 | Nurmi |
| 2003/0206832 | A1 | 11/2003 | Thiebaud et al. |
| 2004/0115905 | A1 | 6/2004 | Barge et al. |
| 2004/0219072 | A1 | 11/2004 | Yamakawa et al. |
| 2005/0121090 | A1 | 6/2005 | Hunnicutt |
| 2005/0200001 | A1 | 9/2005 | Joshi et al. |
| 2005/0205136 | A1 | 9/2005 | Freeman |
| 2006/0017125 | A1 | 1/2006 | Lee et al. |
| 2006/0067649 | A1 | 3/2006 | Tung et al. |
| 2006/0218953 | A1 | 10/2006 | Hirota |
| 2007/0251586 | A1 | 11/2007 | Fuller et al. |
| 2007/0289941 | A1 | 12/2007 | Davies |
| 2008/0028779 | A1 | 2/2008 | Song |
| 2008/0042084 | A1 | 2/2008 | Fuller |
| 2008/0072977 | A1 | 3/2008 | George et al. |
| 2008/0229770 | A1 | 9/2008 | Liu |
| 2008/0271788 | A1 | 11/2008 | Matsuzaki et al. |
| 2009/0123300 | A1 | 5/2009 | Uibel |
| 2009/0186466 | A1 | 7/2009 | Brewer |
| 2010/0019177 | A1 | 1/2010 | Luckevich |
| 2010/0038576 | A1 | 2/2010 | Hunnicutt |
| 2010/0204840 | A1 | 8/2010 | Sun et al. |
| 2010/0225708 | A1 | 9/2010 | Peng et al. |
| 2011/0112606 | A1 | 5/2011 | Gatherer et al. |
| 2012/0000550 | A1 | 1/2012 | Hunnicutt et al. |

FOREIGN PATENT DOCUMENTS

| | | |
|---|---|---|
| DE | 3401404 | 7/1985 |
| DE | 4101575 | 7/1992 |
| DE | 4417251 | 11/1995 |
| DE | 4422942 | 1/1996 |
| EP | 250948 | 1/1988 |
| EP | 261972 | 3/1988 |
| EP | 1024285 | 8/2000 |
| GB | 2238267 | 5/1991 |
| JP | Sho 39-990 | 2/1964 |
| JP | 04-000003 | 1/1992 |
| JP | 06-117414 | 4/1994 |
| JP | 2001184125 | 7/2001 |
| JP | 2003-049933 | 2/2003 |
| JP | Sho 63-148062 | 7/2003 |
| JP | 2006-080194 | 3/2006 |
| WO | 99/16096 A1 | 4/1999 |
| WO | 99/24783 A1 | 5/1999 |
| WO | 00/14415 A2 | 3/2000 |
| WO | 00/14415 A3 | 7/2000 |
| WO | 2005/084211 A2 | 9/2005 |
| WO | 2005/084211 A3 | 1/2006 |
| WO | 2006/076386 A1 | 7/2006 |
| WO | 2008/076388 A1 | 6/2008 |
| WO | 2008/076388 B1 | 8/2008 |
| WO | 2008/121365 A1 | 10/2008 |
| WO | 2008/121369 A1 | 10/2008 |
| WO | 2010/019329 A2 | 2/2010 |
| WO | 2010/019329 A3 | 2/2010 |
| WO | 2010/019665 A2 | 2/2010 |
| WO | 2010/019665 A3 | 2/2010 |
| WO | 2010/065804 A2 | 6/2010 |
| WO | 2010/065804 A3 | 6/2010 |
| WO | 2011/022267 A2 | 2/2011 |
| WO | 2011/022267 A3 | 2/2011 |
| WO | 2011/094300 A2 | 8/2011 |
| WO | 2011/094300 A3 | 8/2011 |
| WO | 2011/094302 A2 | 8/2011 |
| WO | 2011/094302 A3 | 8/2011 |

OTHER PUBLICATIONS

Asuha, Hikaru Kobayashi et al, "Nitric acid oxidation of Si to form ultrathin silicon dioxide layers with a low leakage current density", 2003, Journal of Applied Physics, 94, 7328.

Ayon et al., "Etching Characteristics and Profile Control in a Time Multiplexed ICP Etcher," Proc. Of Solid State Sensor and Actuator Workshop Technical Digest, Hilton Head SC, (Jun. 1998) 41-44.

B.E. Deal and A.S. Grove, "General relationship for the thermal Oxidation of Silicon", 1965, Journal of Applied Physics, 36, 3770.

Bachmann, Stephan, "Electronic Expansion Valves: Fitters Notes (Part 8)", Danfoss Fitters Notes, Jul. 2008.

Bartha et al., "Low Temperature Etching of Si in High Density Plasma Using SF6/02," Microelectronic Engineering, and Actuator Workshop Technical Digest, Hilton Head SC, (Jun. 1998) 41-44.

Biography, Ohio State University Website [online], [retrieved Dec. 31, 2000]. Retrieved from the Internet <URL: http://www.chemistry.ohio-state.edu/resource/pubs/brochure/madou.htm>.

Booth, Steve and Kaina, Rachid, Fluid Handling—Big Gains from Tiny Valve, Appliance Design (Apr. 2008), pp. 46-48.

Changenet et al., "Study on predictive functional control of an expansion valve for controlling the evaporator superheat", Proc.IMechE vol. 222 Part I, May 28, 2008, pp. 571-582.

Clark, Scott, "Etching Silicon Dioxide with Aqueous Hf Solutions", Copyright 1998-2000, Bold Technologies Inc., http://www.bold-tech.com/technical/silicon_dioxide.htm.

Controls Overview for Microstaq Silicon Expansion Valve (SEV), Rev. 1, Dec. 2008 [online], [retrieved May 17, 2010]. Retrieved from the Internet <URL: http://www.microstaq.com/pdf/SEV_controls.pdf>.

Copeland, Michael V., Electronic valves promise big energy savings, FORTUNE, Sep. 9, 2008 [online], [retrieved Sep. 9, 2008]. Retrieved from the internet <URL: http://techland.blogs.fortune.cnn.com/2008/09/09/electronic-valves-promise-big-energy-savings>.

Fung et al., "Deep Etching of Silicon Using Plasma" Proc. Of the Workshop on Micromachining and Micropackaging of Transducers, (Nov. 7-8, 1984) pp. 159-164.

Gui, C. et al, "Selective Wafer Bonding by Surface Roughness Control", Journal of The Electrochemical Society, 148 (4) G225-G228 (2001).

Gui, C. et al., "Fusion bonding of rough surfaces with polishing technique for silicon micromachining", Microsystem Technologies (1997) 122-128.

Günther, Götz, "Entwicklung eines pneumatischen 3/2-Wege-Mikroventils", O+ P Olhydraulik Und Pneumatik, Vereinigte Fachverlage, Mainz, DE, vol. 42, No. 6, Jun. 1, 1998, pp. 396-398, XP000831050, ISSN: 0341-2660.

Higginbotham, Stacey, Microstaq's Tiny Valves Mean Big Energy Savings [online], [retrieved Dec. 8, 2008]. Retrieved from the Internet <URL: http//earth2tech.com/2008/09/09/microstaqs-tiny-valves-mean-big-energy savings (posted Sep. 9, 2008)>.

J. Mark Noworolski, et al.,"Process for in-plane and out-of-plane single-crystal-silicon thermal microactuators", Sensors and Actuators A 55 (1996); pp. 65-69.

Jonsmann et al., "Compliant Electra-thermal Microactuators", IEEE Technical Digest, Twelfth IEEE International Conference on Micro Electro Mechanical Systems Jan. 17-21, 1999, Orlando, Florida, pp. 588-593, IEEE Catalog Number: 99CH36291C.

K.R. Williams et al., "A Silicon Microvalve For The Proportional Control Of Fluids", TRANSDUCERS '99, Proc. 10th International Conference on Solid State Sensors and Actuators, held Jun. 7-10, 1999, Sendai, Japan, pp. 18-21.

(56) References Cited

OTHER PUBLICATIONS

Keefe, Bob, Texas firm says value-replacing chip can drastically cut energy use, Atlanta Metro News, Sep. 10, 2008 [online], [retrieved Sep. 10, 2008]. Retrieved from the Internet <URL: http://www.ajc.com/search/content/shared/money/stories/2008/09/microstaq10_cox-F9782.html>.

Klaassen et al., "Silicon Fusion Bonding and Deep Reactive Ion Etching; A New Technology for Microstructures," Proc., Transducers 95 Stockholm Sweden, (1995) 556-559.

Linder et al., "Deep Dry Etching Techniques as a New IC Compatible Tool for Silicon Micromachining," Proc, Transducers, vol. 91, (Jun. 1991) pp. 524-527.

Luckevich, Mark, MEMS microvlaves: the new valve world, Valve World (May 2007), pp. 79-83.

Madou, Marc, "Fundamentals of Microfabrication", Boca Raton: CRC Press, 1997, 405-406.

MEMS, Microfluidics and Microsystems Executive Review [online], Posted Apr. 16, 2009. [retrieved May 17, 2010]. Retrieved from the Internet <URL: http:www.memsinvestorjournal.com/2009/04/mems-applications-for-flow-control.html>.

Microstaq Announces High Volume Production of MEMS-Based Silicon Expansion Valve [onlne], [retrieved Jan. 27, 2010]. Retrieved from the Internet <URL: http://www.earthtimes.org/articles/printpressstory.php?news+1138955 (posted Jan. 27, 2010)>.

Microstaq Product Description, Proportional Piloted Silicon Control Valve (CPS-4) [online], Published 2008, [retrieved May 17, 2010]. Retrieved from the Internet <URL: http://www.microstaq.com/products/cps4.html>.

Microstaq Product Description, Proportional Direct Acting Silicon Control Valve (PDA-3) [online], Published 2008, [retrieved May 17, 2010]. Retrieved from the Internet <URL: http://www.microstaq.com/products/pda3.html>.

Microstaq Product Descriptions, SEV, CPS-4, and PDA-3 [online], Published 2009, [retrieved May 17, 2010]. Retrieved from the Internet <URL: http://www.microstaq.com/products/index.html>.

Microstaq Technology Page [online], Published 2008, [retrieved May 17, 2010]. Retrieved from the Internet <URL: http://www.microstaq.com/technology/index.html>.

Petersen et al. "Surfaced Micromachined Structures Fabricated with Silicon Fusion Bonding" Proc., Transducers 91, (Jun. 1992) pp. 397-399.

Press Release, Freescale and Microstaq Join Forces on Smart Superheat Control System for HVAC and Refrigeration Efficiency (posted Jan. 22, 2008) [online], [retrieved May 17, 2010]. Retrieved from the Internet <URL: http://www.microstaq.com/pressReleases/prDetail_04.html>.

Press Release, Microstaq Unveils Revolutionary Silicon Expansion Valve at Demo 2008 [online], [retrieved May 17, 2010]. Retrieved from the Internet <URL: http://www.microstaq.com/pressReleases/prDetail_05.html (posted Sep. 8, 2008)>.

Press Release, Microstaq Mastering Electronic Controls for Fluid-Control Industry (posted May 5, 2005) [online[, [retrieved May 17, 2010]. Retrieved from the Internet <URL: http://www.microstaq.com/pressReleases/prDetail_02.html>.

Press Release, Nanotechnology Partnerships, Connections Spur Innovation for Fluid Control Industries (posted Jun. 9, 2005) [online], [retrieved May 17, 2010]. Retrieved from the Internet <URL: http://www.microstaq.com/pressReleases/prDetail_03.html>.

Product Review, greentechZONE Products for the week of May 18, 2009 [online], [retrieved May 17, 2010]. Retrieved from the Internet <URL: http://www.en-genius.net/site/zones/greentechZONE/product_reviews/grnp_051809>.

SEV Installation Instructions [online], [retrieved May 17, 2010]. Retrieved from the Internet <URL: http://www.microstaq.com/pdf/SEV_Instruction_sheet.pdf>.

Silicon Expansion Valve Information Sheet [online], [retrieved May 17, 2010]. Retrieved from the Internet <URL: http://www.microstaq.com/pdf/SEV_Infosheet_2_0.pdf>.

Silicon Expansion Valve Data Sheet [online], [retrieved May 17, 2010]. Retrieved from the Internet <URL: http://www.microstaq.com/pdf/SEV_Datasheet_1_8.pdf>.

Silicon Expansion Valve (SEV)—For Heating, Cooling, and Refrigeration Applications [online], [retrieved May 17, 2010]. Retrieved from the Internet <URL: http://www.microstaq.com/pdf/SEV_Quicksheet.pdf>.

SMIC Announces Successful Qualification of a MEMS Chip for Microstaq (posted Oct. 26, 2009) [online], [retrieved May 17, 2010]. Retrieved from the Internet <URL: http://www.prnewswire.com/news-releases/smic-announces-successful-qualification-of-a-mems-chip-for-microstaq-65968252.html (posted Oct. 26, 2009)>.

SMIC quals Microstaq MEMS chip for fluid control (posted Oct. 26, 2009) [online], [retrieved May 17, 2010]. Retrieved from the Internet <URL: http://www.electroiq.com/ElectroiQ/en-us/index/display/Nanotech_Article_Tools_Template.articles.small-times.nanotechmems.mems.microfluidics.2009.10.smic-quals_microstaq.html>.

Tiny Silicon Chip Developed by Microstaq Will Revolutionize Car Technology (posted May 19, 2005) [online], [retrieved May 19, 2005]. Retrieved from the Internet <URL: http://www.nsti.org/press/PRshow.html?id=160>.

Turpin, Joanna R., Soft Economy, Energy Prices Spur Interest in Technologies [online], Published Dec. 8, 2008. [retrieved May 18, 2010]. Retrieved from the Internet <URL: http://www.achrnews.com/copyright/BNP_GUID_9-5-2006_A_10000000000000483182>.

Uibel, Jeff, The Miniaturization of Flow Control (Article prepared for the 9th International Symposium on Fluid Control Measurement and Visualization (FLUCOME 2007)), Journal of Visualization (vol. 11, No. 1, 2008), IOS Press.

Yunkin et al., "Highly Anisotropic Selective Reactive Ion Etching of Deep Trenches in Silicon," Microelectronic Engineering, Elsevier Science B.V., vol. 23, (1994) pp. 373-376.

Zhang, Chunbo et al, "Fabrication of thick silicon dioxide layers for thermal isolation", 2004, J.Micromech. Microeng. 14 769-774.

Zhixiong Liu et al., "Micromechanism fabrication using silicon fusion bonding", Robotics and Computer Integrated Manufacturing 17 (2001) 131-137.

\* cited by examiner

METHOD FOR MAKING A SOLDER JOINT

BACKGROUND OF THE INVENTION

Various embodiments of a method of forming a solder joint are described herein. In particular, the embodiments described herein relate to a method of forming a solder joint with improved process control and superior solder joint reliability.

Solder is frequently used in the production of electronic components to join integrated circuit modules or chip carriers to circuit cards or circuit boards. For example, solder may be used to connect conductive metal pins from a module to the conductive circuit lines of a circuit card. It is known to apply solder to the components in the form of a solder preform or a solder paste. A solder preform is a solid composition of solder or braze material fabricated to the shape and dimensions required to contact the desired locations of each of the components to be joined. The preform is placed in proper position and subsequently heated to cause the solder to flow, or "reflow," and physically join the components.

Solder paste is a composition of a solder powder in one or more liquid solvents or binders. The paste is screened on to the components, dried, and heated to reflow the solder and join the two components. For both preforms and pastes, a liquid flux is typically used to deoxidize the metal surfaces of the components to cause them to accept the solder.

The use of a conventional liquid flux results in flux residues left behind on the surface of the components after soldering. For example, a common flux such as waterwhite rosin leaves a metal salt residue abietate formed when the abietic acid in the rosin reacts with oxides on the metal surfaces of the components. Where the residue contacts the metal surfaces of the components, it will cause detrimental galvanic corrosion upon the passage of electrical current in normal use. Thus, the residue must be removed from the components after soldering and before electrical use.

Another problem associated with that of soldering electronic components is that of precision. To assure that proper electrical connections, electrical components must often be joined according to tight dimensional tolerances. Solder preforms are inherently difficult to use in such applications because precision is limited by the accuracy by which the preform is placed upon the components, and fixtures must be used to hold the electrical components, circuit modules, or chip carriers to circuit cards or circuit boards during the solder reflow process.

Micro electro mechanical systems (MEMS) are a class of systems that are physically small, having some features or clearances with sizes in the micrometer range or smaller (i.e., smaller than about 10 microns). These systems have both electrical and mechanical components. The term "micro machining" is commonly understood to mean the production of three-dimensional structures and moving parts of MEMS devices. MEMS originally used modified integrated circuit (e.g., computer chip) fabrication techniques (such as chemical etching) and materials (such as silicon semiconductor material) to micro machine these very small mechanical devices. Today there are many more micro machining techniques and materials available. The term "MEMS device" as may be used in this application is defined as a device that includes a micro machined component having some features or clearances with sizes in the micrometer range, or smaller (i.e., smaller than about 10 microns). It should be noted that if components other than the micro machined component are included in the MEMS device, these other components may be micro machined components or standard sized (i.e., larger) components. Similarly, the term "microvalve" as may be used in this application means a valve having features or clearances with sizes in the micrometer range, or smaller (i.e., smaller than about 10 microns) and thus by definition is at least partially formed by micro machining. The term "microvalve device" as may be used herein means a device that includes a microvalve, and that may include other components. It should be noted that if components other than a microvalve are included in the microvalve device, these other components may be micro machined components or standard sized (i.e., larger) components. The term "MEMS package" as used herein should be understood to mean a device, which includes a micromachined component and may include other components that may be micromachined components or standard sized components. A "MEMS fluidic package" should be understood to be a MEMS package including a fluid passageway. A "MEMS electrofluidic package" as used herein should be understood to be a MEMS package including a fluid passageway and an electrically active component that may be a micromachined component. A "MEMS package platform" as used herein should be understood to be an interface component or assembly of components upon which a MEMS device may be mounted and by means of which the MEMS device can be interfaced with an external system.

Many MEMS devices may be made of multiple layers (or substrates) of material, which may be micromachined to form components of the MEMS device prior to assembly of the multiple layers into a completed MEMS device. For example, such a MEMS device may be manufactured using suitable MEMS fabrication techniques, such as the fabrication techniques disclosed in U.S. Pat. No. 6,761,420, the disclosures of which are incorporated herein by reference; U.S. Pat. No. 7,367,359, the disclosures of which are incorporated herein by reference; Klassen, E. H. et al. (1995). "Silicon Fusion Bonding and Deep Reactive Ion Etching: A New Technology for Microstructures," Proc. Transducers 95 Stockholm Sweden, pp. 556-559, the disclosures of which are incorporated herein by reference; and Petersen, K. E. et al. (Jun. 1991). "Surface Micromachined Structures Fabricated with Silicon Fusion Bonding", "Proceedings, Transducers" 91, pp. 397-399, the disclosures of which are incorporated herein by reference.

Flux and/or flux residue may undesirably coat the internal moving components of the MEMS device when a MEMS device is attached to a substrate using known soldering processes.

The above notwithstanding, there remains a need in the art for an improved method of forming a solder joint.

SUMMARY OF THE INVENTION

The present application describes various embodiments of a method of forming a solder joint. In one embodiment, a method of soldering an electrical component to a substrate includes dispensing solder paste onto a substrate. Solder preform is then urged into contact with the solder paste. An aperture is formed through the solder preform, such that solder paste is urged through the aperture. An electrical component is then urged into contact with the solder preform and into contact with the solder paste that has been urged through the aperture, thereby bonding the electrical component, the solder preform, and the substrate together.

Other advantages of the method of forming a solder joint will become apparent to those skilled in the art from the following detailed description, when read in light of the accompanying drawings.

DETAILED DESCRIPTION OF THE INVENTION

The present invention will now be described with occasional reference to the specific embodiments of the invention. This invention may, however, be embodied in different forms and should not be construed as limited to the embodiments set forth herein. Rather, these embodiments are provided so that this disclosure will be thorough and complete, and will fully convey the scope of the invention to those skilled in the art.

Unless otherwise defined, all technical and scientific terms used herein have the same meaning as commonly understood by one of ordinary skill in the art to which this invention belongs. The terminology used in the description of the invention herein is for describing particular embodiments only and is not intended to be limiting of the invention. As used in the description of the invention and the appended claims, the singular forms "a," "an," and "the" are intended to include the plural forms as well, unless the context clearly indicates otherwise.

Unless otherwise indicated, all numbers expressing quantities of ingredients, properties such as molecular weight, reaction conditions, and so forth as used in the specification and claims are to be understood as being modified in all instances by the term "about." Accordingly, unless otherwise indicated, the numerical properties set forth in the specification and claims are approximations that may vary depending on the desired properties sought to be obtained in embodiments of the present invention. Notwithstanding that the numerical ranges and parameters setting forth the broad scope of the invention are approximations, the numerical values set forth in the specific examples are reported as precisely as possible. Any numerical values, however, inherently contain certain errors necessarily resulting from error found in their respective measurements.

Figure 1:
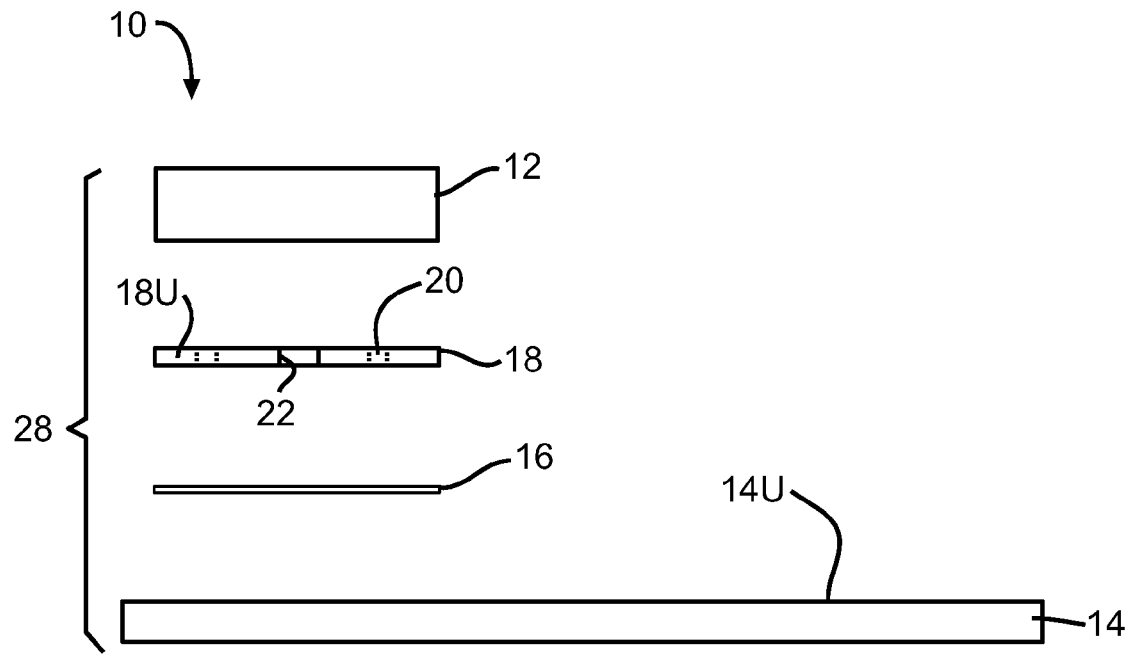
FIG. 1 is an exploded schematic elevational view of a reflow subassembly manufactured according to the method of the invention.

Referring now to the Figures, there is shown in FIG. 1 a schematic illustration of a method of soldering an electrical component to a substrate according to the invention is shown at 10. In the illustrated embodiment, an electrical component 12 is bonded to a substrate 14, such as for use in automotive or air conditioning applications. In the illustrated embodiment, the electrical component 12 is a micro-electrical-mechanical system (MEMS) sensor. Alternatively, the electrical component may be any desired electrical component, such as a microvalve, a MEMs device, a MEMS package, a MEMS fluidic package, a semiconductor component, a circuit module, and a chip carrier.

In the illustrated embodiment, the substrate 14 is formed from metal, such as brass. Alternatively, the substrate 14 may be formed from any other desired metal or non-metal.

In a first step of the method 10, solder paste 16 is applied to a first or upper surface 14U of the substrate 14. In the illustrated embodiment, the solder paste 16 is applied using a screen printing process. The screen printing process is used to apply uniformly thick deposits of solder paste 16 at one or more discrete locations on the substrate 14. Such screen printing of the solder paste 16 provides precise control of the volume and pattern of the solder paste 16 at the desired discrete locations.

The solder paste 16 may be any desired solder paste. As used herein, "solder paste" is defined as a homogenous mixture of solder alloy powder and a flux system. The solder paste 16 should have characteristics that provide good printing and dispensing, and exhibit good reflow characteristics. Examples of solder pastes that have been found to be suitable in some applications to practice the method described herein include tin-lead and indium-lead solder pastes, such as manufactured by Indium Corporation, which has an office in Clinton, New York.

In a second step of the method 10, an engineered solder preform 18 is deposited on the screen printed layer of solder paste 16. As used herein, a "solder preform" is defined as a solid composition of solder or braze material fabricated to the shape and dimensions required to contact the desired locations of each of the components to be joined. Solder preforms contain precise and predetermined quantities of an alloy or pure metal, such as lead-tin or lead-indium.

Figure 2:
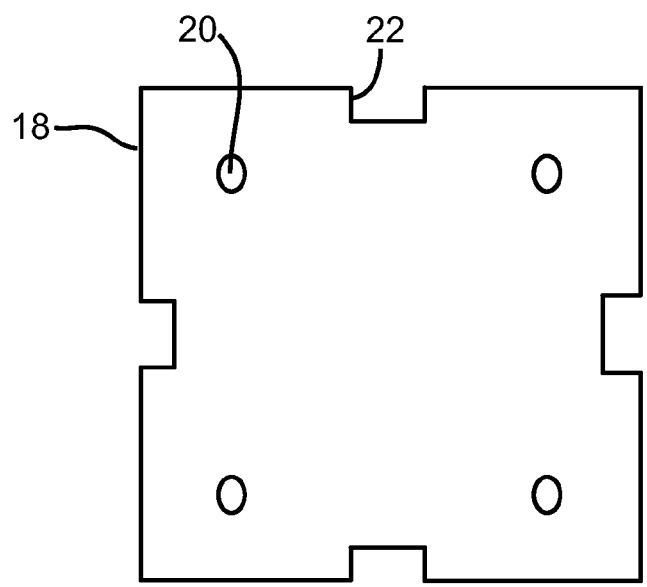
FIG. 2 is an enlarged plan view of a first embodiment of the solder preform illustrated in FIG. 1.

As best shown in FIG. 2, a first embodiment of the solder preform 18 is substantially square and includes at least one aperture 20 and at least one notch 22. Alternatively, the solder preform 18 may have any other desired shape corresponding to the desired shape of the solder joint between the electrical component 12 and the substrate 14. The illustrated solder preform 18 includes four oval apertures 20 and one notch 22 on each side of the solder preform 18. Alternatively, any desired number of apertures 20 and/or notches 22 may be formed in the solder preform 18, and the apertures 20 and/or notches 22 may have any desired shape or combination of shapes.

Figure 3:
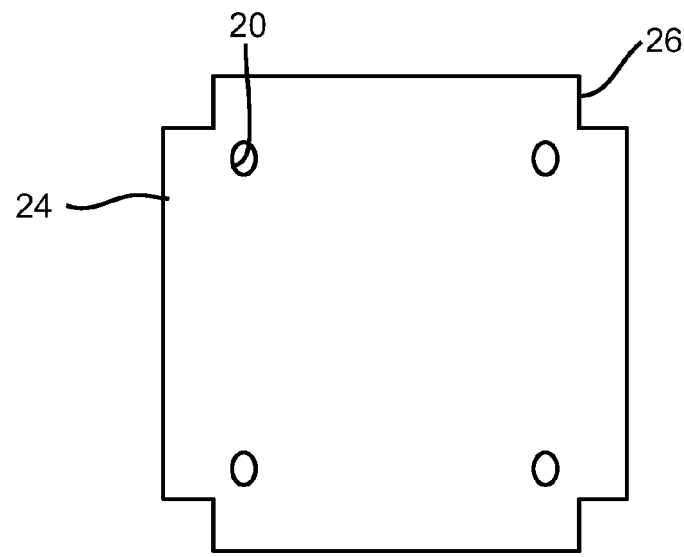
FIG. 3 is an enlarged plan view of a second embodiment of the solder preform.

Referring now to FIG. 3, a second embodiment of the solder preform 24 is substantially square and includes at least one aperture 20 and at least one notch 26. In the illustrated embodiment of the solder preform 24, the notches 26 are formed in the corners of the solder preform 24. It will be understood that one or more notches 26 may be formed at any desired location along the peripheral edges of the solder preform 24.

The solder preform 18, 24 is then urged into contact with the solder paste 16 such that a limited amount of solder paste 16 is urged through the apertures 20 and notches 22. As used herein, the phrase "limited amount of solder paste" is defined as a quantity of solder paste approximating the minimum amount of solder paste needed to develop the mechanical properties required to hold components, such as the electrical component 12 and the substrate 14 in the spatial relationship into which they are assembled when subjected to ordinary handling during a manufacturing process that includes a subsequent soldering operation and/or a subsequent reflow operation. As described herein, the limited amount of solder paste 16 that is urged through the apertures 20 and notches 22 is sufficient to fill and at least partially spill over the edges of the apertures 20 and notches 22.

Figure 4:
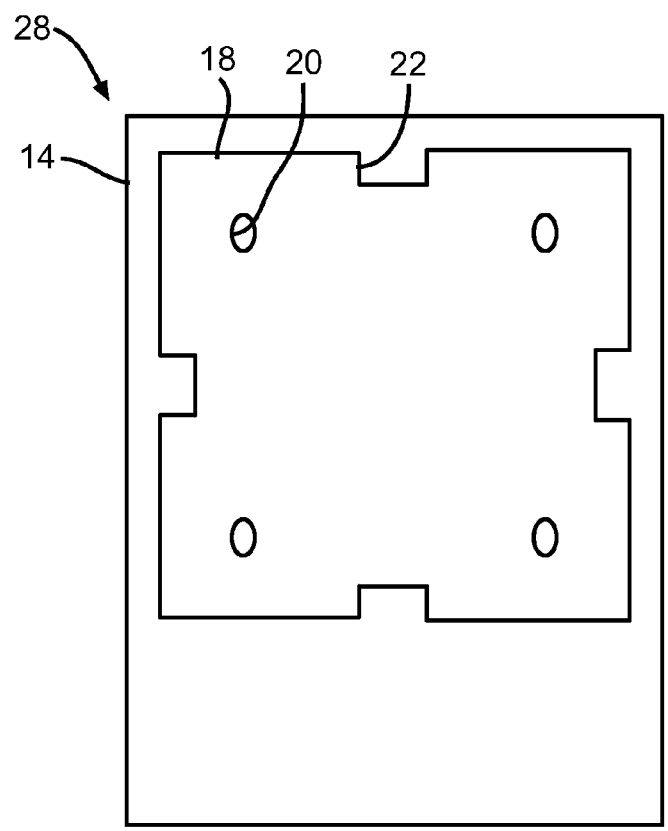
FIG. 4 is a plan view of the assembled reflow subassembly illustrated in FIG. 1.

In a third step of the method 10, the electrical component 12 is urged into contact with the solder preform 18 and into contact with the solder paste 16 that has been urged through the apertures 20 and notches 22. The tacky solder paste 16 preliminarily bonds the electrical component 12, the solder preform 18, and the substrate 14 together to define a reflow subassembly 28, as shown in FIGS. 1 and 4, in preparation for a subsequent reflow operation (not shown). As used herein, the phrase "preliminarily bond" is defined as a permanent or semi-permanent bond strong enough to allow the reflow subassembly to be handled, moved to a source of heat, and subsequently heated, such as in a reflow operation, without the use of a fixture.

In a fourth step (not shown) of the method 10, the reflow subassembly 28 is moved to a source of heat where the electrical component 12, the solder preform 18, and the substrate 14 of the reflow subassembly 28 are bonded together in a reflow operation.

Advantageously, because the tacky solder paste 16 bonds the electrical component 12, the solder preform 18, and the substrate 14 together prior to a reflow operation, no fixtures are required to hold the reflow subassembly 28 together.

Further, flux within the limited amount of solder paste 16 that has been urged through the apertures 20 and notches 22 provides sufficient, but not excessive, flux to a first or upper surface 18U of the solder preform 18. Such improved delivery of flux (within the solder paste 16) to the interface of the solder preform 18 and the electrical component 12, provides increased strength of the solder joint relative to other known methods of solder fortification.

Additionally, unlike known methods of solder fortification, additional adhesive material may not be required between the solder preform 18 and the electrical component 12.

It will be understood that the embodiments of the inventive method described herein is useful for components with internal moving components that may be exposed to the solder paste during assembly. The inventive method limits contamination of such internal moving components with flux from the solder paste, which may cause sticking of the moving components. The embodiments of the inventive method are also useful for components without internal moving components, such as microprocessor chips and memory chips since this method can be easily automated for manufacturing highly reliable solder joints.

The principle and mode of operation of the method of forming a solder joint have been described in its preferred embodiment. However, it should be noted that the method of forming a solder joint described herein may be practiced otherwise than as specifically illustrated and described without departing from its scope.

What is claimed is:

1. A method of bonding a component to a substrate comprising:
    applying solder paste on to a substrate;
    urging a solder preform made of solder or braze material into contact with the solder paste, the solder preform having a channel in the form of at least one of an aperture and a notch formed therethrough, such that solder paste is urged through the channel in an amount sufficient to fill and at least partially spill over edges of the channel; and
    urging a component into contact with the solder preform and into contact with the solder paste that has been urged through the channel, thereby bonding the component, the solder preform, and the substrate together to define a reflow subassembly.

2. The method according to claim 1, wherein the component is a MEMS device.

3. The method according to claim 1, wherein the solder paste includes flux.

4. The method according to claim 1, wherein the substrate is metal.

5. The method according to claim 1, further including the step of moving the reflow subassembly to a source of heat.

6. The method according to claim 5, further including the step of applying heat from the source of heat to the reflow subassembly, thereby reflowing the solder preform to bond the component and the substrate together, and defining a solder joint.

7. The method according to claim 1, wherein the bond between the component, the solder preform, and the substrate is strong enough to allow the reflow subassembly to be moved to a subsequent process step without an assembly fixture.

8. The method according to claim 1, wherein the solder paste is applied on to the substrate using a screen printing process.

9. A method of bonding a MEMS device to a substrate comprising:
    applying solder paste on to a substrate;
    urging a solder preform made of solder or braze material into contact with the solder paste, the solder preform having an aperture formed therethrough, such that solder paste is urged through the aperture in an amount sufficient to fill and at least partially spill over edges of the aperture; and
    urging a MEMS device into contact with the solder preform and the solder paste that has been urged through the aperture, thereby bonding the MEMS device, the solder preform, and the substrate together to define a reflow subassembly.

10. The method according to claim 9, wherein the solder paste includes flux.

11. The method according to claim 10, wherein the limited amount of solder paste that is urged through the aperture provides flux between the solder preform and the MEMS device via the solder paste.

12. The method according to claim 9, wherein the substrate is formed from metal.

13. The method according to claim 9, further including the step of moving the reflow subassembly to a source of heat.

14. The method according to claim 13, further including the step of applying heat from the source of heat to the reflow subassembly, thereby reflowing the solder preform to bond the MEMS device and the substrate together, and defining a solder joint.

15. The method according to claim 9, wherein the bond between the MEMS device, the solder preform, and the substrate is strong enough to allow the reflow subassembly to be moved to a subsequent process step without an assembly fixture.

16. A method of bonding a component to a substrate comprising:
    a) applying a quantity of a fluxing agent on to a substrate;
    b) providing a solder preform made of solder or braze material having at least one channel in the form of at least one of an aperture and a notch formed therethrough,
    c) urging the solder preform into the fluxing agent, such that a portion of the fluxing agent is displaced through the channel formed in the solder preform in an amount sufficient to fill and at least partially spill over edges of the channel; and
    d) urging a component into contact with some of the fluxing agent that has been urged through the channel.

17. The method of claim 16 where the fluxing agent is a solder paste containing solder and flux.

18. The method of claim 16 wherein the component has a flat surface, and wherein the flat surface of the component is urged into contact with the portion of the fluxing agent displaced through the channel, such that the portion of the fluxing agent disposed in an interface of the solder preform and the component provides a quantity of flux quantity required to achieve a good solder joint and not a quantity of flux excessive to that required to achieve a good solder joint.

* * * * *